(12) United States Patent
Ding

(10) Patent No.: US 12,368,051 B2
(45) Date of Patent: Jul. 22, 2025

(54) SEMICONDUCTOR TEST SAMPLE AND MANUFACTURING METHOD THEREOF

(71) Applicant: CHANGXIN MEMORY TECHNOLOGIES, INC., Hefei (CN)

(72) Inventor: Rui Ding, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/602,898

(22) PCT Filed: Jul. 22, 2021

(86) PCT No.: PCT/CN2021/107826
§ 371 (c)(1),
(2) Date: Jan. 12, 2023

(87) PCT Pub. No.: WO2023/279442
PCT Pub. Date: Jan. 12, 2023

(65) Prior Publication Data
US 2024/0055271 A1    Feb. 15, 2024

(30) Foreign Application Priority Data
Jul. 5, 2021 (CN) .......................... 202110756511.6

(51) Int. Cl.
*H01L 21/321* (2006.01)
*H01L 21/02* (2006.01)
*H01L 21/3213* (2006.01)

(52) U.S. Cl.
CPC .... *H01L 21/3213* (2013.01); *H01L 21/02282* (2013.01)

(58) Field of Classification Search
CPC ........... H01L 21/3213; H01L 21/02282; H01L 21/32134; H01L 22/14; H01L 22/34; G01N 1/28
(Continued)

(56) References Cited

U.S. PATENT DOCUMENTS 9,741,532 B1   8/2017  Bedell et al.
2008/0006786 A1  1/2008  Williamson et al.
(Continued)

FOREIGN PATENT DOCUMENTS

CN    101419400 A    4/2009
CN    102374942 A    3/2012
(Continued)

OTHER PUBLICATIONS

International Search Report in Application No. PCT/CN2021/107826, mailed on Apr. 8, 2022.
(Continued)

*Primary Examiner* — Duy Vu N Deo
(74) *Attorney, Agent, or Firm* — Syncoda LLC; Feng Ma

(57) ABSTRACT

A method of manufacturing a semiconductor test sample includes: providing a product to be analyzed, the product comprises a conductive interconnection layer and a semiconductor doped region located below the conductive interconnection layer; selectively removing a conductive material from the conductive interconnection layer, replacing the conductive material with a non-conductive material and replacing the conductive interconnection layer with an insulating sacrificial layer; and taking the product including both the insulating sacrificial layer and the semiconductor doped region as a semiconductor test sample.

9 Claims, 5 Drawing Sheets

(58) Field of Classification Search
USPC .................................. 438/691–694, 745, 754
See application file for complete search history.

(56) References Cited

U.S. PATENT DOCUMENTS

| | | | |
|---|---|---|---|
| 2015/0111316 A1 | 4/2015 | Koschinsky et al. | |
| 2020/0301192 A1* | 9/2020 | Huang | G02F 1/133308 |
| 2021/0210643 A1* | 7/2021 | Shimatani | H01L 27/14601 |
| 2022/0199803 A1* | 6/2022 | Han | H01L 21/823418 |

FOREIGN PATENT DOCUMENTS

| | | | | |
|---|---|---|---|---|
| CN | 104078343 A | | 10/2014 | |
| CN | 104241156 A | * | 12/2014 | ......... G01N 23/2202 |
| CN | 104458371 A | | 3/2015 | |
| CN | 108106890 A | | 6/2018 | |
| CN | 208738231 U | | 4/2019 | |
| CN | 112435961 A | | 3/2021 | |
| CN | 113484113 A | | 10/2021 | |

OTHER PUBLICATIONS

CN first office action in Application No. 202110756511.6, mailed on Feb. 23, 2022.

* cited by examiner

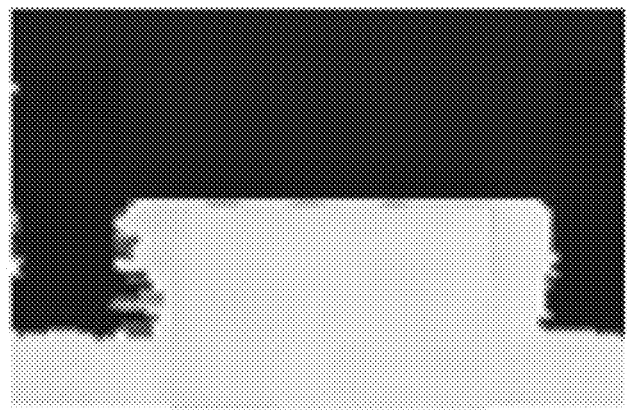

FIG. 9

```
┌─────────────────────────────────────────────────┐
│  Provide a product to be analyzed, the product  │
│  comprises a conductive interconnection layer   │ ～S101
│  and a semiconductor doped region located       │
│  below the conductive interconnection layer     │
└─────────────────────────────────────────────────┘
                         │
                         ▼
┌─────────────────────────────────────────────────┐
│  Selectively remove a conductive material from  │
│  the conductive interconnection layer,          │
│  replacing the conductive material with a       │ ～S102
│  non-conductive material and replacing the      │
│  conductive interconnection layer with an       │
│  insulating sacrificial layer                   │
└─────────────────────────────────────────────────┘
```

FIG. 10

SEMICONDUCTOR TEST SAMPLE AND MANUFACTURING METHOD THEREOF

CROSS-REFERENCE TO RELATED APPLICATIONS

This application is a national stage of International Application No. PCT/CN2021/107826 filed on Jul. 22, 2021, which claims priority to Chinese Patent Application No. 202110756511.6 filed on Jul. 5, 2021 The disclosures of these applications are hereby incorporated by reference in their entirety.

TECHNICAL FIELD

The present disclosure relates to the technical field of semiconductors, in particular to a semiconductor test sample and a manufacturing method thereof.

BACKGROUND

In a structure of semiconductor transistors, it is vital to confirm an implant profile since ion implantation is determinative of semiconductors. As shown in FIG. 1, in most cases, scanning capacity microscopy (SCM) and scanning spreading resistance microscopy (SSRM) are currently used in industry to detect two-dimensional (2D) shapes of ion implantation, but the SCM and the SSRM have extremely high requirements for sample manufacturing.

SUMMARY

Embodiments of the present disclosure provides a semiconductor test sample and a manufacturing method thereof, which are configured to eliminate influence of a metal conductor on imaging contrast of an ion implantation region in imaging technologies such as scanning spreading resistance microscopy (SSRM), thereby improving scanning quality of the SSRM.

The embodiment of the present disclosure provides the method of manufacturing a semiconductor test sample. The method includes:
  providing a product to be analyzed, the product includes a conductive interconnection layer and a semiconductor doped region located below the conductive interconnection layer;
  selectively removing a conductive material from the conductive interconnection layer, replacing the conductive material with a non-conductive material and replacing the conductive interconnection layer with an insulating sacrificial layer; and
  taking the product including both the insulating sacrificial layer and the semiconductor doped region as the test sample.

The method includes: providing a product to be analyzed, the product includes a conductive interconnection layer and a semiconductor doped region located below the conductive interconnection layer; selectively removing a conductive material from the conductive interconnection layer, replacing the conductive material with a non-conductive material and replacing the conductive interconnection layer with an insulating sacrificial layer; and taking the product including both the insulating sacrificial layer and the semiconductor doped region as a test sample, thereby eliminating the influence of the metal conductor on the imaging contrast of the ion implantation region in imaging technologies such as scanning spreading resistance microscopy (SSRM), and improving the scanning quality of the SSRM.

The semiconductor test sample provided by the embodiment of the present disclosure is manufactured through the method of any one described.

BRIEF DESCRIPTION OF THE DRAWINGS

To describe the technical solutions in the embodiments of the present disclosure more clearly, the following briefly describes the accompanying drawings required in descriptions of the embodiments. Apparently, the accompanying drawings in the following descriptions show merely some embodiments of the present disclosure, and a person of ordinary skill in the art can still derive other accompanying drawings from these accompanying drawings without creative efforts.

FIG. 9 is a schematic diagram of SSRM testing obtained after the metal layer is removed, provided by an embodiment of the present disclosure; and FIG. 10 is a schematic flowchart of a method of manufacturing a semiconductor test sample provided by an embodiment of the present disclosure.

DETAILED DESCRIPTION

The following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure without creative efforts shall fall within the protection scope of the present disclosure.

The embodiments of the present disclosure provide a semiconductor test sample and a manufacturing method thereof, which are configured to eliminate influence of a metal conductor on imaging contrast of an ion implantation region (that is a doped region) in imaging technologies such as scanning spreading resistance microscopy (SSRM), thereby improving scanning quality of the SSRM.

According to the embodiment of the present disclosure, in a link of manufacturing of the semiconductor test sample, a conductive material in a conductive interconnection layer of a transistor is removed through wet etching, a non-conductive material (for example inorganic matter) is used for filling, and the conductive interconnection layer is replaced with an insulating sacrificial layer, such that influence of the above problem on an image effect during SSRM testing may be effectively relieved.

Figure 1:
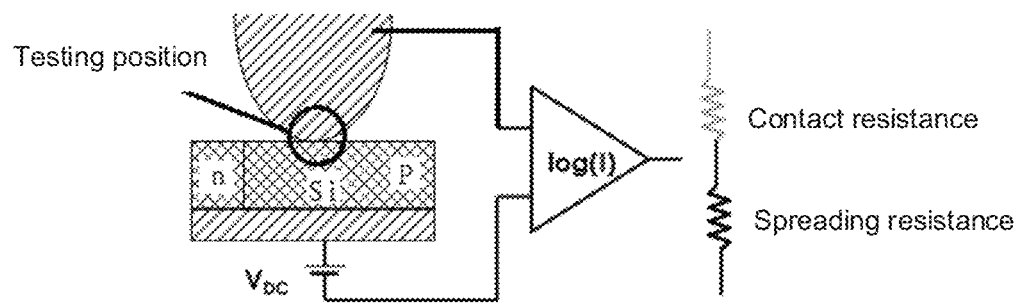
FIG. 1 is a positional schematic diagram for a transistor during scanning spreading resistance microscopy (SSRM) testing in the prior art.
Figure 2:
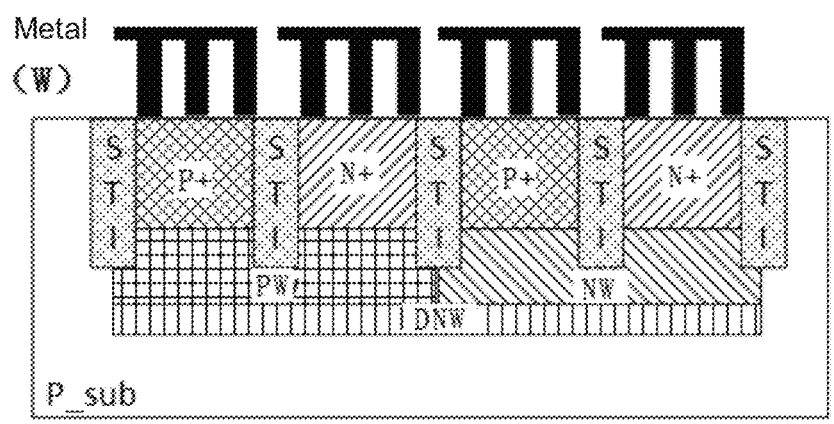
FIG. 2 is a sectional schematic diagram of an electrostatic discharge (ESD) circuit structure provided by an embodiment of the present disclosure.

Referring to FIG. 2 is a section of an electro-static discharge (ESD) circuit structure. A source region and a drain region of the transistor are subjected to polysilicon doping, a source and a drain are connected to metal (generally tungsten W), and an ion doped region as an emphasis in the embodiment of the present disclosure is made from a semiconductor. In FIG. 2, PW represents a P well, NW represents an N well, STI represents a shallow trench isolation structure, P+ represents a P-type doped region, and N+ represents an N-type doped region. DNW represents a deep doped N well, and P-sub represents a P-type substrate.

Figure 3:
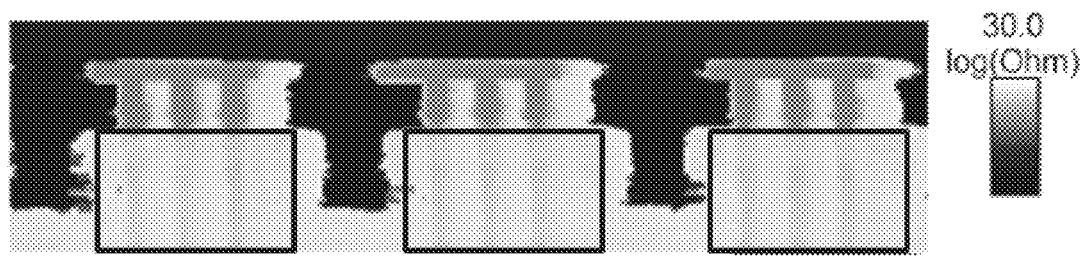
FIG. 3 is a schematic diagram of weakening or even disappearance of contrast in an ion-doped region caused by metal provided by an embodiment of the present disclosure.

The structure of the product shown in FIG. 2 is taken as an example. If the product is tested by using the prior art, for example, the SSRM is configured to infer relative change of an ion implantation concentration by scanning change of a resistance of a section of a transistor. The metal which is a conductor and has conductivity higher than $10^3$ (S/cm) is quite different from the doped region which is a semiconductor and has conductivity between $10^{-8}$-$10^3$ (S/cm). During SSRM imaging, the metal conductor may make imaging of the doped region to be weakened or even unrecognized. For example, with reference to FIG. 3, the metal causes the contrast of the ion doped region to be weakened or even disappear. In FIG. 3, 600 nm is a scale, log (Ohm) is the logarithm of the resistance, and the conductivity has a reciprocal relationship with the resistance. A region shown by a rectangular frame in FIG. 3 corresponds to the doped region, and FIG. 3 corresponds to the structure shown in FIG. 2, and shows existence of an MO layer (that is, the metal layer closest to the doped region, black regions in strips above the rectangular frame in FIG. 3). Since the conductivity of the metal is much larger than the conductivity of the semiconductor (the doped region), distribution of the conductivity of the doped region has poor visibility, and can hardly be seen in other words.

The structure shown in FIG. 2 is merely a schematic example of a doping type, and there are many doping types. The technical solution provided by the embodiment of the present disclosure is not limited to the structure. A doped region which may come into contact with the metal may be applied to the technical solution provided by the embodiment of the present disclosure to prepare a test sample for testing.

According to the technical solution provided by the embodiment of the present disclosure, the scanning quality of the SSRM is improved by optimizing manufacturing of an SSRM sample. The SSRM sample is a product provided for the SSRM for testing. In other words, specifically, in the embodiment of the present disclosure, a semiconductor structure subjected to ion implantation serves as the SSRM test sample, and the SSRM test sample may also be called a semiconductor test sample in the embodiment of the present disclosure. The semiconductor structure described in the embodiment of the present disclosure is a structure subjected to doping, specifically, the doped region of the transistor in the embodiment of the present disclosure.

The embodiment of the present disclosure does not change a test value of the doped region, but contrast of concentration distribution of the doped region becomes more obvious, such that testing becomes more convenient.

On the whole, the method of manufacturing the test sample provided by the embodiment of the present disclosure includes: provide a product to be analyzed, the product to be analyzed includes a conductive interconnection layer and a semiconductor doped region located below the conductive interconnection layer, remove a conductive material from the conductive interconnection layer of the product to be analyzed through selective wet etching, and replace the conductive material with a non-conductive inorganic matter, so as to eliminate influence of the metal conductor on contrast of a semiconductor ion doped region in SSRM. The conductive material includes, for example, the metal material.

It should be noted that the semiconductor test sample manufactured by the method provided by the embodiment of the present disclosure may further be used for other purposes, besides SSRM testing, for example atom probe tomography (APT) sample manufacturing, etc. In other words, the semiconductor test sample manufactured by the method provided by the embodiment of the present disclosure may not only be configured to the SSRM testing but to other tests.

A specific embodiment is given below as an example for description.

Figure 4:
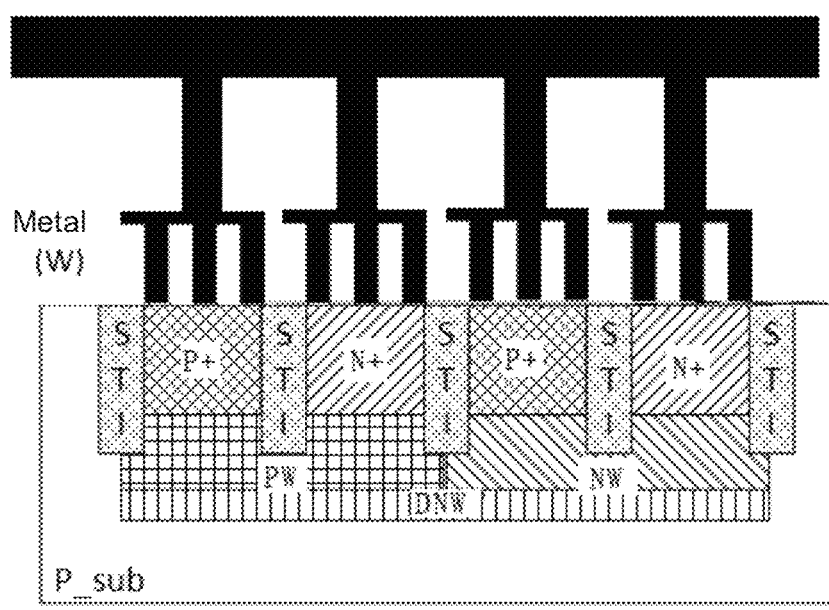
FIG. 4 is a schematic diagram of performing plane polishing on an SSRM sample until metal of a metal layer is completely exposed, provided by an embodiment of the present disclosure.

A method of manufacturing a semiconductor test sample provided by the embodiment of the present disclosure includes, for example the following steps:

1. With reference to FIG. 4, a product to be analyzed is provided, and the product to be analyzed is subjected to plane polishing to completely expose metal of an MO layer. The product to be analyzed includes a conductive interconnection layer and a semiconductor doped region located below the conductive interconnection layer.

The MO layer, also a metal layer, is the conductive interconnection layer, but the conductive interconnection layer described in the embodiment of the present disclosure may include a plurality of metal layers, wherein the MO layer is the metal layer closest to the semiconductor doped region and is a conductive structure interconnected to a transistor.

It should be noted that in the embodiment of the present disclosure, the conductive interconnection layer may also be polished to a predetermined height, so as to expose the conductive material. That is, in the embodiment of the present disclosure, a portion of the conductive interconnection layer may be polished off and then the metal may be removed. As for the predetermined height, it may be determined according to actual needs, which is not limited in the embodiment of the present disclosure.

Figure 5:
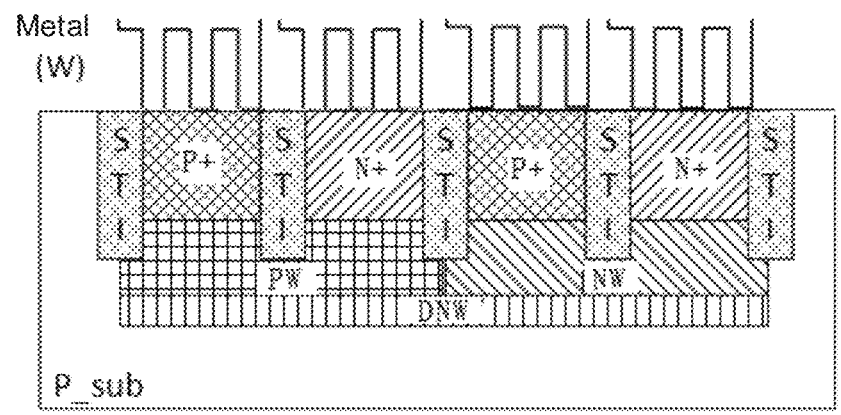
FIG. 5 is a schematic diagram of removal of a metal material through wet selective etching provided by an embodiment of the present disclosure.

2. A metal material, other than other materials to be kept, is removed through wet selective etching, as shown in FIG. 5. The metal material, for example W, is subjected to the wet selective etching at room temperature with a solution of hydrogen peroxide:ammonium hydroxide=1:1. A solution with high selectivity for tungsten and a substrate may be used in the embodiment of the present disclosure, but is not limited to the above solution.

Figure 6:
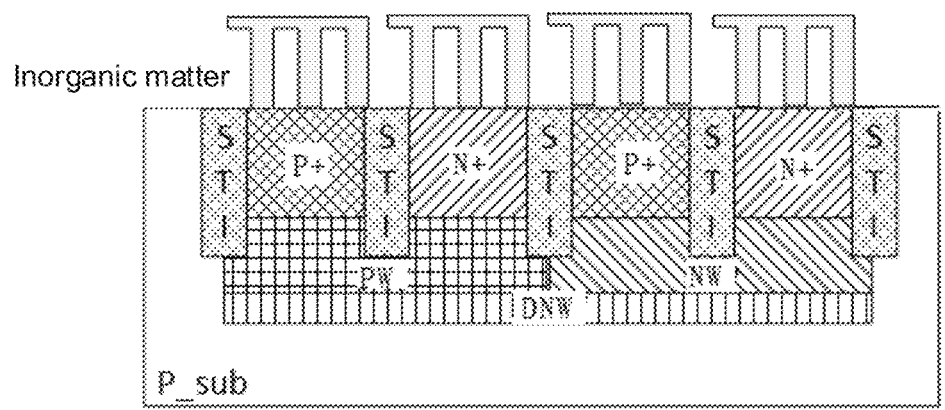
FIG. 6 is a schematic diagram of replacing a metal material with non-conductive inorganic matter provided by an embodiment of the present disclosure.

3. A surface of the product to be analyzed subjected to processing of above steps is spin coated with a silicone sealant, and a hole generated by W is filled to obtain a structure shown in FIG. 6. Inorganic materials other than the silicone sealant may be used as materials for spin coating the surface of the product to be analyzed subjected to the processing of above steps, which is not limited in the embodiment of the present disclosure.

4. Conventional operations include, but are not limited to, the product of the above step is left to stand until the silicone sealant is solidified, then conventional cross section polishing is performed to the vicinity of a target, then cutting is performed to a designated position through focused ion beam (FIB). Chemical mechanical polishing (CMP), if used directly, may damage a region to be tested, so the FIB is used for cutting when approaching a target region. The FIB, short for the focused ion beam technology, may be used to cut a chip structure. It may be understood that in a process of manufacturing a test sample, the whole chip is processed first, but it is possible that during testing, only a small region may need to be selected as a sample and sent to a testing machine, and the FIB technology is the technology to cut the small region.

Figure 7:
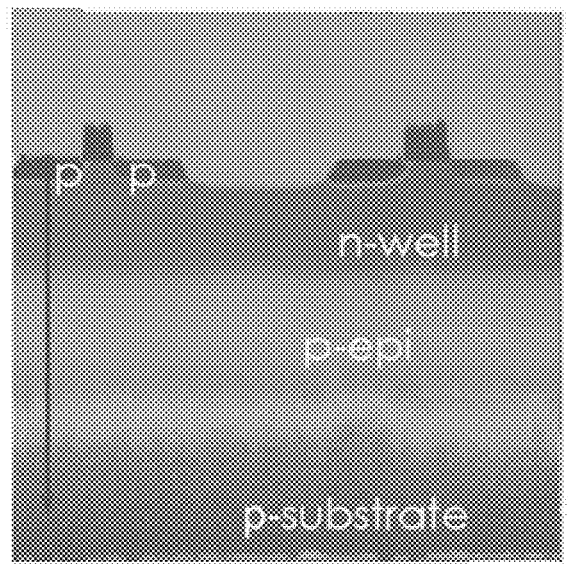
FIG. 7 is a schematic diagram of increasing of gradient contrast of different doping concentrations in an ion implantation region provided by an embodiment of the present disclosure.

According to the technical solution provided by the embodiment of the present disclosure, influence of existence of a metal conductor on two-dimensional shape imaging of an ion-doped region in SSRM technology may be effectively eliminated, and gradient contrast of different doping concentrations in the ion-implanted region may be increased, such that the doping gradient contrast is more obvious, as shown in FIG. 7. In FIG. 7, P-epi represents a P epitaxial layer, and the figure represents another doping type, which is different from the doping type in FIG. 6. By measuring a resistance and feeding back change of the doping concentration, contrast of the doping concentration is more detailed.

Figure 8:
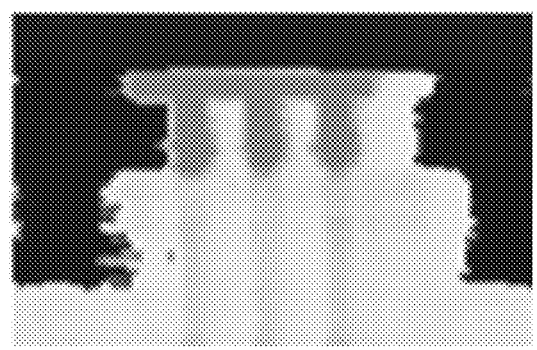
FIG. 8 is a schematic diagram of SSRM testing obtained before a metal layer is removed, provided by an embodiment of the present disclosure.

According to the technical solution provided by the embodiment of the present disclosure, by removing the metal material, it is possible to preferentially solve the problem of curtain caused by the influence of a heavy metal element in sample manufacturing through the FIB, and avoid curtain interference of the SSRM sample manufacturing through the FIB, that is, avoid the curtain brought by the metal substance in the sample manufacturing through the FIB, as shown in FIGS. 8 and 9. FIG. 8 shows a test chart obtained before the metal layer (MO layer) is removed, and FIG. 9 is a test chart after the MO layer is removed, which shows a better image effect. It should be noted that the resistance of the doped region itself may not change, but the test chart obtained from the sample manufactured in the embodiment of the present disclosure is more convenient to view and analyze by workers.

To sum up, according to the method of manufacturing a semiconductor test sample provided by the embodiment of the present disclosure, the surface is subjected to plane polishing to metal firstly, the metal is subjected to wet selective etching, and the original position of the metal is filled with the silicone sealant through spin coating, thus solving the influence of the existence of the metal conductor on the imaging contrast of the ion implantation region in SSRM imaging technology.

As shown in FIG. 10, a method of manufacturing a semiconductor test sample provided by the embodiment of the present disclosure includes:

S101. A product to be analyzed is provided, the product includes a conductive interconnection layer and a semiconductor doped region located below the conductive interconnection layer.

The conductive interconnection layer of the product includes, for example a metal layer of a transistor.

The semiconductor doped region located below the conductive interconnection layer includes, for example a P-type doped region and an N-type doped region.

S102. A conductive material is selectively removed from the conductive interconnection layer, the conductive material is replaced with a non-conductive material and the conductive interconnection layer is replaced with an insulating sacrificial layer.

In the embodiment of the present disclosure, the product including both the insulating sacrificial layer and the semiconductor doped region is taken as a test sample.

In an embodiment, the selectively removing a conductive material from the conductive interconnection layer specifically includes:

the product is polished until the conductive material in the conductive interconnection layer is exposed; and the conductive material is removed through wet etching.

Alternatively, in an embodiment, the selectively removing a conductive material from the conductive interconnection layer specifically includes:

the product is polished until the conductive interconnection layer is polished to a predetermined height to expose the conductive material; and the conductive material is removed from the conductive interconnection layer through wet etching.

In an embodiment, the conductive material is tungsten, and the wet etching is performed at room temperature with a solution of hydrogen peroxide:ammonium hydroxide=1:1.

In an embodiment, the replacing the conductive material with a non-conductive material and replacing the conductive interconnection layer with an insulating sacrificial layer specifically include:

a surface of the product is spin coated with the non-conductive material, and a hole, generated by removing the conductive material, is filled with the non-conductive material, and formed the insulating sacrificial layer.

In an embodiment, the non-conductive material includes inorganic matter.

In an embodiment, the inorganic matter is a silicone sealant.

In an embodiment, after the surface of the product is spin coated with the non-conductive material, the method further includes:

the product is left to stand until the non-conductive material is solidified.

In an embodiment, after the non-conductive material is solidified, the method further includes:

cross section polishing is performed on the product to a target position, and cutting is performed to a designated position through a focused ion beam technology.

The embodiment of the present disclosure further provides a semiconductor test sample manufactured through the above method, which includes the insulating sacrificial layer and the semiconductor doped region, the insulating sacrificial layer is a layer structure obtained by replacing a conductive material in the conductive interconnection layer with a non-conductive material. For example, in a structure of a transistor shown in FIG. 4, the below semiconductor doped region remains unchanged, the nearest metal layer thereof is replaced with inorganic matter. Other specific structures of the transistor are described above, and are not repeated herein.

A person of ordinary skill in the art shall understand that the embodiment of the present disclosure may be provided as a method, a system, or a computer program product. Therefore, the present disclosure may take the form of an entirely hardware embodiment, an entirely software embodiment, or an embodiment combining software and hardware. Moreover, the present disclosure may use a form of a computer program product that is implemented on one or more computer-usable storage media that include computer usable program codes. The storage media include but are not limited to a disk storage, a compact disc read-only memory (CD-ROM), an optical memory, etc.

The present disclosure is described with reference to the flowcharts and/or block diagrams of the method, the device (system), and the computer program product according to the embodiments of the present disclosure. It should be understood that each flow and/or block in the flowchart and/or block diagram and a combination of the flow and/or block in the flowchart and/or block diagram can be implemented by computer program instructions. These computer program instructions may be provided for a processor of a general-purpose computer, a special-purpose computer, an embedded processing machine, or other programmable data processing device to produce a machine, such that instructions executed by the processor of the computer or other programmable data processing device are generated to realize a device with a function specified in one or more flows of the flowchart and/or one or more blocks of the block diagram.

These computer program instructions may also be stored in a computer readable memory that can guide a computer or other programmable data processing device to work in a specific manner, such that the instructions stored in the computer readable memory produce an article of manufacture including an instruction device, the instruction device implements the functions specified in one or more flows of the flowchart and/or one or more blocks in the flowchart.

These computer program instructions may also be loaded onto the computer or other programmable data processing device, such that a series of operating steps are performed on the computer or other programmable device to generate computer-implemented processing, and instructions executed on the computer or other programmable device provide steps for implementing the functions specified in the one or more flows of the flowchart and/or one or more blocks in the flowchart.

Although the preferred embodiments of the present disclosure have been described, a person of ordinary skill in the art can make additional changes and modifications to these embodiments once they learn the basic inventive concept. Therefore, the appended claims are intended to be interpreted as including the preferred embodiments and all changes and modifications falling within the scope of the present disclosure.

Apparently, a person of ordinary skill in the art may make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure is also intended to include these modifications and variations.

What is claimed is:

1. A method of manufacturing a semiconductor test sample, comprising:
providing a product to be analyzed, the product comprises a conductive interconnection layer and a semiconductor doped region located below the conductive interconnection layer;
selectively removing a conductive material from the conductive interconnection layer, replacing the conductive material with a non-conductive material and replacing the conductive interconnection layer with an insulating sacrificial layer; and
taking the product comprising both the insulating sacrificial layer and the semiconductor doped region as the semiconductor test sample;
wherein the selectively removing the conductive material from the conductive interconnection layer comprises:
polishing the product until the conductive material in the conductive interconnection layer is exposed; and
removing the conductive material through wet etching.

2. The method according to claim 1, wherein
the conductive material is tungsten, and the wet etching is performed at room temperature with a solution of hydrogen peroxide: ammonium hydroxide=1:1.

3. The method according to claim 1, wherein
the replacing the conductive material with the non-conductive material and replacing the conductive interconnection layer with the insulating sacrificial layer comprise:
spin coating a surface of the product with the non-conductive material, and filling a hole, generated by removing the conductive material, with the non-conductive material, and forming the insulating sacrificial layer.

4. The method according to claim 1, wherein
the non-conductive material comprises inorganic matter.

5. The method according to claim 4, wherein
the inorganic matter is a silicone sealant.

6. The method according to claim 3, wherein
after the spin coating the surface of the product with the non-conductive material, the method further comprises:
leaving the product to stand until the non-conductive material is solidified.

7. The method according to claim 6, wherein
after the non-conductive material is solidified, the method further comprises:
performing cross section polishing on the product to a target position, and cutting the product to a designated position through a focused ion beam technology.

8. A method of manufacturing a semiconductor test sample, comprising:
providing a product to be analyzed, the product comprises a conductive interconnection layer and a semiconductor doped region located below the conductive interconnection layer;
selectively removing a conductive material from the conductive interconnection layer, replacing the conductive material with a non-conductive material and replacing the conductive interconnection layer with an insulating sacrificial layer; and
taking the product comprising both the insulating sacrificial layer and the semiconductor doped region as the semiconductor test sample;
wherein the selectively removing the conductive material from the conductive interconnection layer comprises:
polishing the product, and the conductive interconnection layer is polished to a predetermined height to expose the conductive material; and
removing the conductive material from the conductive interconnection layer through wet etching.

9. The method according to claim 8, wherein
the conductive material is tungsten, and the wet etching is performed at room temperature with a solution of hydrogen peroxide: ammonium hydroxide=1:1.

* * * * *